(12) United States Patent
Tani

(10) Patent No.: US 7,479,853 B2
(45) Date of Patent: Jan. 20, 2009

(54) BALANCED TYPE SURFACE ACOUSTIC WAVE FILTER

(75) Inventor: Masakazu Tani, Hakusan (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 325 days.

(21) Appl. No.: 10/595,289

(22) PCT Filed: Aug. 9, 2005

(86) PCT No.: PCT/JP2005/014551

§ 371 (c)(1),
(2), (4) Date: Apr. 5, 2006

(87) PCT Pub. No.: WO2006/025193

PCT Pub. Date: Mar. 9, 2006

(65) Prior Publication Data

US 2007/0052499 A1 Mar. 8, 2007

(30) Foreign Application Priority Data

Sep. 2, 2004 (JP) .............................. 2004-255914

(51) Int. Cl.
 *H03H 9/64* (2006.01)
(52) U.S. Cl. .................... 333/195; 310/313 D; 333/193
(58) Field of Classification Search ................. 333/193, 333/195; 310/313 B
See application file for complete search history.

(56) References Cited

U.S. PATENT DOCUMENTS

| 6,420,946 B1 | 7/2002 | Bauer et al. |
| 6,667,673 B1 | 12/2003 | Strauss |
| 2002/0145361 A1 | 10/2002 | Shibata et al. |
| 2003/0164745 A1* | 9/2003 | Takamine .................... 333/195 |
| 2004/0080385 A1* | 4/2004 | Takamine et al. ........... 333/195 |
| 2004/0196119 A1* | 10/2004 | Shibahara et al. ........... 333/193 |

FOREIGN PATENT DOCUMENTS

| JP | 11-239035 | 8/1999 |
| JP | 2002-084164 | 3/2002 |
| JP | 2002-528987 | 9/2002 |
| JP | 2002-374147 | 12/2002 |

(Continued)

OTHER PUBLICATIONS

International Search Report for PCT Application No. PCT/JP2005/014551, mailed Nov. 15, 2005.

(Continued)

*Primary Examiner*—Barbara Summons
(74) *Attorney, Agent, or Firm*—Keating & Bennett, LLP

(57) ABSTRACT

In a balanced type surface acoustic wave filter, a first longitudinally coupled resonator-type surface acoustic wave filter portion connected to an unbalanced input terminal and a second longitudinally coupled resonator-type surface acoustic wave filter portion connected to first and second balanced input terminals are two-stage cascade connected. In the first longitudinally coupled resonator-type surface acoustic wave filter portion, in a portion in which first and second IDTs are adjacent to each other and a portion in which second and third IDTs are adjacent to each other, weighting is performed on a plurality of electrode fingers including the outermost electrode finger closest to the adjacent IDT, in at least one of the adjacent IDTs.

12 Claims, 5 Drawing Sheets

FOREIGN PATENT DOCUMENTS

| | | |
|---|---|---|
| JP | 2003-507917 | 2/2003 |
| JP | 2003-087081 | 3/2003 |
| JP | 2003-324335 | 11/2003 |
| JP | 2004-007713 | 1/2004 |
| JP | 2004-096244 | 3/2004 |

OTHER PUBLICATIONS

Official communication issued in the counterpart Korean Application No. 10-2006-7006621, mailed on Jan. 30, 2007.

Offical communication issued in counterpart Chinese Application No. 200580001073.1, issued on Jun. 6, 2008.

* cited by examiner

BALANCED TYPE SURFACE ACOUSTIC WAVE FILTER

BACKGROUND OF THE INVENTION

1. Field of the Invention

The present invention relates to a balanced-type surface acoustic wave filter having a balanced-to-unbalanced conversion function, and more particularly, to a balanced-type surface acoustic wave filter in which first and second longitudinally coupled resonator-type surface acoustic wave filter portions are cascade connected.

2. Description of the Related Art

In recent years, with the reduction in size and weight of communication devices such as portable telephones, surface acoustic wave filters are widely used as bandpass filters which can have a small size. Furthermore, with the reduction in size of communication devices, the combination of constituent components is highly desired. Among such surface acoustic wave filters, a surface acoustic wave filter having a balanced-to-unbalanced conversion function is commonly used.

For example, in Japanese Unexamined Patent Application Publication No. 2002-84164 (Patent Document 1), a longitudinally coupled resonator-type surface acoustic wave filter having a balanced-to-unbalanced conversion function shown in FIG. 9 is disclosed.

As shown in FIG. 9, in a surface acoustic wave filter 300 described in Patent Document 1, an electrode structure shown in FIG. 9 is provided on a surface acoustic wave substrate. That is, a first longitudinally coupled resonator-type surface acoustic wave filter portion 301 and a second longitudinally coupled resonator-type surface acoustic wave filter portion 302 are provided. In the surface acoustic wave filter portion 301, first to third IDTs 303 to 305 are arranged in the surface wave propagation direction. Reflectors 306 and 307 are disposed on both sides in the surface wave propagation direction of an area in which the IDTs 303 to 305 are disposed.

In a similar manner, in the second surface acoustic wave filter portion 302, fourth to sixth IDTs 308 to 310 are disposed along the surface wave propagation direction. Reflectors 311 and 312 are disposed on both sides in the surface wave propagation direction of the IDTs 308 to 310.

One terminal of the first surface acoustic wave filter portion 301 is connected to an unbalanced input terminal 313. The first and second surface acoustic wave filter portions 301 and 302 are cascade connected. Then, one terminal of the IDT 309 of the second surface acoustic wave filter portion 302 is connected to a first balanced output terminal 314 and the other terminal is connected to a second balanced output terminal 315.

Here, the first and second surface acoustic wave filter portions 301 and 302 are cascade connected. Furthermore, a signal flowing in a signal line 316 for connecting the IDT 303 and the IDT 308 is opposite in phase to a signal flowing in a signal line 317 for connecting between the IDTs 305 and 310.

In Japanese Unexamined Patent Application Publication No. 2004-7713 (Patent Document 2), a surface acoustic wave filter with a balanced-to-unbalanced conversion function having an electrode structure shown in FIG. 10 is disclosed. As shown in FIG. 10, a longitudinally coupled resonator-type surface acoustic wave filter 400 is arranged in a similar manner as the surface acoustic wave filter 300 shown in FIG. 9 except that weighting is performed in a second surface acoustic wave filter portion 402 and narrow-pitched electrode-finger portions are provided in the first and second surface acoustic wave filter portions 401 and 402. Accordingly, corresponding reference numerals are used for corresponding portions and their description is omitted.

Here, in IDTs 403 to 405 and IDTs 408 to 410, in a pair of adjacent IDTs, a narrow-pitched electrode-finger portion N is arranged such that the pitch of a plurality of electrode fingers including the outermost electrode finger on the side of the opposite IDT is narrower than the pitch of the main electrode fingers of the respective IDT. The discontinuity in the adjacent portions of the IDTs is compensated for by providing the narrow-pitched electrode-finger portion N and filter characteristics are improved. In addition, in the longitudinally coupled resonator-type surface acoustic wave filter 400, in the two-stage cascade connection-type structure, in the surface acoustic wave filter portion 402 connected to first and second balanced output terminals 414 and 415, in addition to the above-described narrow-pitched electrode-finger portion, weighting by differing the electrode-finger cross-widths is provided.

The balancing is improved such that a signal flowing in one signal line 416 for connecting the first surface acoustic wave filter portion 401 and the second surface acoustic wave filter portion 402 is different in phase from a signal flowing in the other signal line 417.

Furthermore, when the above-described cross-width weighting is provided, the balancing is further improved.

When the above-described surface acoustic wave device having a balanced-to-unbalanced conversion function is a three-port device, wherein, for example, the unbalanced input terminal is port 1 and the balanced output terminals are port 2 and port 3, respectively, the amplitude balancing and phase balancing are defined as follows:

$$\text{Amplitude balancing} = |A| \qquad \text{formula (1)}$$

$$A = |20 \log (S21)| - |20 \log (S31)|$$

$$\text{Phase balancing} = |B| \qquad (2)$$

$$B = |\angle S21 - \angle S31|$$

Moreover, S21 represents a transfer coefficient from port 1 to port 2 and S31 represents a transfer coefficient from port 1 to port 3. Ideal balancing in the filter characteristics of a surface acoustic wave device is when the amplitude balancing is 0 dB and the phase balancing is 180 degrees in the passband.

As described above, Patent Documents 1 and 2 disclose balanced-type surface acoustic wave filters 300 and 400 of a two-element cascade-connection type in which balancing is improved. However, in these surface acoustic wave filters 300 and 400, there is a problem in that a steep spike-like ripple is generated in the amplitude balancing characteristics and phase balancing characteristics in the passband. Accordingly, the improvement of balancing is not sufficient.

SUMMARY OF THE INVENTION

To overcome the problems described above, preferred embodiments of the present invention provide a balanced-type surface acoustic wave filter in which the above-described problems in the related are solved. Particularly, in a balanced-type surface acoustic wave filter having first and second longitudinally coupled resonator-type surface acoustic wave filter portions that are two-stage cascade connected, the generation of the above-described spike-like ripple is effectively prevented in the amplitude balancing characteristics and phase balancing characteristics in the passband, and accordingly, the balancing is further improved.

A balanced-type surface acoustic wave filter with a balanced-to-unbalanced conversion function having an unbalanced signal terminal and first and second balanced signal terminals according to a preferred embodiment of the present invention includes a piezoelectric substrate, a first longitudinally coupled resonator-type surface acoustic wave filter portion having first to third IDTs disposed along the propagation direction of a surface wave on the piezoelectric substrate, the middle second IDT connected to the unbalanced signal terminal, and a second longitudinally coupled resonator-type surface acoustic wave filter portion having fourth to sixth IDTs disposed along the propagation direction of a surface wave on the piezoelectric substrate, the fourth IDT connected to the first IDT, and the fifth IDT connected to the first and second balanced signal terminals. In the balanced-type surface acoustic wave filter, an electric signal passing through a signal line connecting the first IDT and the fourth IDT is about 180 degrees different in phase from an electric signal passing through a signal line connecting the third IDT and the sixth IDT, and, in the first longitudinally coupled resonator-type surface acoustic wave filter portion, in the portion where the first and second IDTs are adjacent to each other and/or the portion where the second and third IDTs are adjacent to each other, in one of the adjacent IDTs and/or the other of the adjacent IDTs, weighting is provided on a plurality of electrode fingers including the outermost electrode finger which is the closest to the adjacent IDT.

In this preferred embodiment of the present invention, weighting may preferably include cross-width weighting, series weighting, thinning-out weighting, and duty weighting.

In a balanced-type surface acoustic wave filter according to a preferred embodiment of the present invention, of the portion at which the first and second IDTs are adjacent to each other and/or the portion at which the second and third IDTs are adjacent to each other, in the portion where the adjacent outermost electrode fingers are of the same polarity, the weighting is provided.

In a balanced-type surface acoustic wave filter according to another preferred embodiment of the present invention, the weighting is provided such that the length of a plurality of electrode fingers including the outermost electrode finger is different from the other electrode fingers.

In a balanced-type surface acoustic wave filter according to another preferred embodiment of the present invention, the weighting is one of a cross-width weighting and a series weighting.

In a balanced-type surface acoustic wave filter according to another preferred embodiment of the present invention, the electrode fingers in which the weighting is provided are disposed in a narrow-pitched electrode-finger portion.

In a balanced-type surface acoustic wave filter according to another preferred embodiment of the present invention, in the second longitudinally coupled resonator-type surface acoustic wave filter portion, the number of electrode fingers of the fifth IDT located in the middle in the propagation direction of a surface wave is an even number.

In a balanced-type surface acoustic wave filter according to another preferred embodiment of the present invention, one terminal of the fifth IDT in the middle of the second longitudinal resonator-type surface acoustic wave filter portion is connected to a first balanced terminal, and the other terminal is connected to a second balanced signal terminal.

In a balanced-type surface acoustic wave filter according to preferred embodiments of the present invention including first and second longitudinal resonator-type surface acoustic wave filter portions that are two-stage cascade connected with a balanced-to-unbalanced conversion function, an electric signal transmitted through a signal line for connecting a first IDT and a fourth IDT is about 180 degrees different in phase from an electric signal being transmitted through a signal line for connecting a third IDT and a sixth IDT to improve the balancing.

In addition, in the first longitudinally coupled resonator-type surface acoustic wave filter portion, that is, in the longitudinally coupled resonator-type surface acoustic wave filter portion connected to an unbalanced terminal, in a portion where first and second IDTs are adjacent to each other and/or a portion where second and third IDTs are adjacent to each other, in at least one of the adjacent IDTs, weighting is provided on a plurality of electrode fingers including the outermost electrode finger which is the closest to the adjacent IDT, and thus, the spike-like ripple is effectively suppressed in the amplitude balancing characteristics and phase balancing characteristics in the passband.

In particular, in the portion where first and second IDTs are adjacent to each other and/or the portion where second and third IDTs are adjacent to each other, when the weighting is provided in a portion where the outermost electrode fingers are of the same polarity, the spike-like ripple is more effectively suppressed.

In preferred embodiments of the present invention, the above-described spike-like ripple is effectively suppressed where an electric signal flowing in a first balanced signal terminal is 180 degrees different in phase from an electric signal flowing in a second balanced signal terminal, that is, where a first coupling resonator-type surface acoustic wave filter portion is connected to an unbalanced signal terminal. Accordingly, it is believed that a phenomenon related to the above-described spike-like ripple takes place in the portion where the polarity is reversed. Then, in preferred embodiments of the present invention, when weighting is performed in the portion where the polarity is reversed, it is believed that the spike-like ripple is reduced.

Therefore, according to preferred embodiments of the present invention, in comparison with a related balanced-type surface acoustic wave filter of this type, balancing is greatly improved.

On the other hand, in preferred embodiments of the present invention, although various weighting methods can be used as the above-described weighting, preferably, weighting in which the length of a plurality of electrode fingers including the outermost electrode finger is different from that of the other electrode fingers is used. As such a weighting, cross-width weighting and series weighting can also be used. When cross-width weighting or series weighting is used, as is made clear from an experimental example to be descried later, balancing is effectively improved.

Electrode fingers in which weighting is provided may be disposed in a narrow-pitched electrode-finger portion and then, the discontinuity between adjacent IDTs is compensated for.

In a second longitudinally coupled resonator-type surface acoustic wave filter portion, when the number of electrode fingers of a fifth IDT disposed in the middle in the propagation direction of a surface wave is an even number, it is possible to further improve balancing as compared to where the number of electrode fingers of the fifth IDT is an odd number.

Moreover, one terminal of a middle fifth IDT of a second longitudinally coupled resonator-type surface acoustic wave filter portion is electrically connected to a first balanced signal terminal, and the other terminal may be electrically connected to a second balanced signal terminal. In this case, without making the structure of the fifth IDT complicated, the second longitudinally coupled resonator-type surface acoustic wave filter portion can be connected to the first and second balanced signal terminals. In addition, it is possible to provide a balanced-type surface acoustic wave filter in which the ratio between the impedance on the side of the unbalanced terminal and the impedance on the side of the first and second terminals is about 1:1.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 2 shows characteristics of attenuation to frequency of the surface acoustic wave filter of the first preferred embodiment of the present invention.

DETAILED DESCRIPTION OF PREFERRED EMBODIMENTS

Hereinafter, preferred embodiments of the present invention will be described with reference to the drawings.

Figure 1:
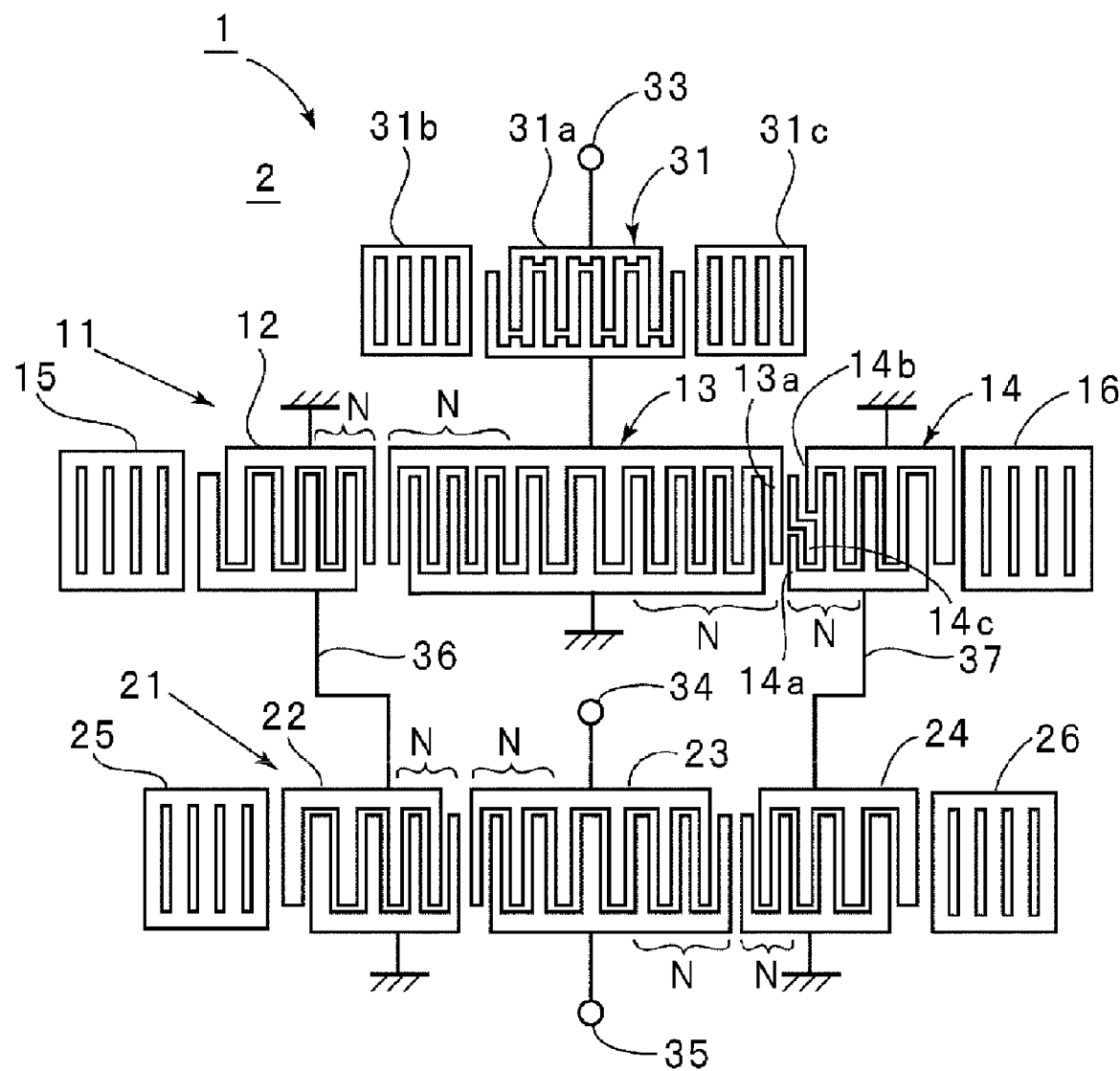
FIG. 1 is a schematic top view showing an electrode structure of a balanced-type surface acoustic wave filter according to a first preferred embodiment of the present invention.

FIG. 1 is a top view showing an electrode structure of a surface acoustic wave filter according to a first preferred embodiment of the present invention. A balanced-type surface acoustic wave filter 1 includes the illustrated electrode structure provided on a surface wave substrate 2. Moreover, in the electrode structure shown in FIG. 1, the number of electrode fingers is less than actual balanced-type surface acoustic wave filters to facilitate illustration thereof.

In the surface acoustic wave filter 1, a first longitudinally coupled resonator-type surface acoustic wave filter portion 11 and a second longitudinally coupled resonator-type surface acoustic wave filter portion 21 are cascade connected.

The first longitudinally coupled resonator-type surface acoustic wave filter portion 11 includes first to third IDTs 12 to 14 disposed along the propagation direction of a surface wave. Reflectors 15 and 16 are disposed on both sides in the surface wave propagation direction of an area where the IDTs 12 to 14 are disposed. Narrow-pitched electrode-finger portions N are provided in a portion where the IDTs 12 and 13 are adjacent to each other and a portion where the IDTs 13 and 14 are adjacent to each other. The narrow-pitched electrode-finger portion N is a portion where the pitch of a plurality of electrode fingers including the outermost electrode finger adjacent to the other IDT is narrower than the pitch of the main electrode-finger portion of the IDT.

When the narrow-pitched electrode-finger portions N are provided, the discontinuity between a pair of adjacent IDTs is lessened and filtering characteristics are improved. However, the narrow-pitched electrode-finger portions N are not necessarily required in the present invention.

Furthermore, the second longitudinally coupled resonator-type surface acoustic wave filter portion 21 includes fourth to sixth IDTs 22 to 24 arranged along the propagation direction of a surface wave and reflectors 25 and 26 disposed in the surface wave propagation direction in an area where the IDTs 22 to 24 are disposed in a manner similar to the first longitudinally coupled resonator-type surface acoustic wave filter portion 11. In the longitudinally coupled resonator-type surface acoustic wave filter portion 21, narrow-pitched electrode-finger portions N are provided in a portion where the IDTs 22 to 24 are adjacent to each other, respectively.

One terminal of the second IDT 13 is connected to an unbalanced input terminal 33 through a one port-type surface acoustic wave resonator 31.

The one port-type surface acoustic wave resonator 31 includes an IDT 31a and reflectors 31b and 31c disposed on both sides in the surface wave propagation direction of the IDT 31a. The one port-type surface acoustic wave resonator 31 is used as an attenuation trap outside the passband of the balanced-type surface acoustic wave filter 1. However, the resonator 31 is not essential in the present invention and may be omitted.

Furthermore, in the second longitudinally coupled resonator-type surface acoustic wave filter portion 21, one terminal of the middle fifth IDT 23 is connected to a first balanced output terminal 34 and the other terminal is connected to a second balanced output terminal 35. Then, the first IDT 12 and the fourth IDT 22 are connected by a first signal line 36. The third IDT 14 and the sixth IDT 24 are connected by a second signal line 37. Accordingly, the balanced-type surface acoustic wave filter 1 of a two-stage cascade-connection type being connected to the unbalanced input 33 and the first and second balanced output terminals 34 and 35 is provided.

The IDT 14 is inverted with respect to the IDT 12 such that a signal flowing in the first signal line 36 is 180 degrees different in phase from a signal flowing in the second signal line 37. Accordingly, in the present preferred embodiment, since the phase of the signals flowing in the first and second lines 36 and 37 is inverted 180 degrees from each other to have a balanced-to-unbalanced conversion function, the degree of balancing is excellent.

Also, in the present preferred embodiment, since the third IDT 14 is weighted in a portion where the second IDT and the third IDT are adjacent to each other, the spike-like ripple appearing in the amplitude balancing and phase balancing in the passband are effectively suppressed.

The outermost electrode finger 13a of the IDT 13 on the side of the IDT 14, and the outermost electrode finger 14a of the IDT 14 on the side of the IDT 13 are hot-side electrode fingers and have the same polarity. In the IDT 14, a plurality of electrode fingers 14a and 14b including the outermost electrode finger 14a on the side of the IDT 13 is series weighted. Series weighting means that weighting is performed by providing a floating electrode finger 14c between the electrode finger 14a and the next electrode finger 14b. The floating electrode finger 14c has a structure in which a first electrode-finger portion extending in the same direction as the electrode finger 14*a* on the tip side of the electrode finger 14*a* with a gap from the electrode finger 14*a* and a second electrode-finger portion extending in the same direction as the electrode finger 14*b* with a gap on the tip side of the electrode finger 14*b* are connected by a third electrode-finger portion extending in the surface wave propagation direction. A series weighting is performed such that a crank-shaped floating electrode finger 14*c* is provided and the length of the outermost electrode finger 14*a* and the length of the electrode finger 14*b* inside the outermost electrode finger 14*a* are reduced. In the portion in which such a series weighting is performed, the application of an electric field is changed by the series weighting and thus, the spike-like ripple is effectively suppressed in the amplitude balancing characteristics and phase balancing characteristics in the passband as is demonstrated in the experimental examples to be described later.

This is described on the basis of specific experimental examples.

In the present preferred embodiment, a reception bandpass filter for a JCDMA system having a passband of 832 to 870 MHz is provided. Here, the ratio of the impedance of the unbalanced input terminal 33 to the impedance of the first and second balanced output terminals 34 and 35 is about 1:2.

A 40±5-degree Y cut X propagation LiTaO3 substrate is preferably used as a piezoelectric substrate 2, a film of aluminum is preferably formed on the piezoelectric substrate 2 and patterned to define an electrode structure of a surface acoustic wave filter according to this preferred embodiment of the present invention. The details of the electrode structure are described as follows.

In the first and second longitudinally coupled resonator-type surface acoustic wave filter portions 11 and 21, a wavelength set by the electrode-finger ratio outside the narrow-pitched electrode-finger portion is denoted as λI.

Electrode-finger cross width: about 46.5 λI

The number of electrode fingers of the first to third IDTs 12 to 14 is 23(7)/(7)36(7)/(7)23 in the order of the first to third IDTs 12 to 14. Moreover, the number in the parentheses represents the number of electrode fingers in the narrow-pitched electrode-finger portions, and the number of electrode fingers outside the parentheses represents the number of electrode fingers outside the narrow-pitched electrode-finger portions of the IDTs. Accordingly, when the first IDT is taken as an example, the number of electrode fingers in the narrow-pitched electrode-finger portion is 7 and the number of electrode fingers outside the narrow-pitched electrode-finger portions is 23.

The number of electrode fingers in the fourth to sixth IDTs 22 to 24 is 24(6)/(4)18(4)/(6)24.

The wavelength λI of an electrode-finger portion outside the narrow-pitched electrode-finger portion of the second IDT 13 is equal to about 4.73 μm, and the wavelength of the narrow-pitched electrode-finger portion of the second IDT 13 is equal to about 4.30 μm. The wavelength λI of electrode-finger portions outside the narrow-pitched electrode-finger portions of the first and third IDTs 12 and 14 is equal to about 4.64 μm, and the wavelength λ2n of the narrow-pitched electrode-finger portion of the IDTs 12 and 14 is equal to about 4.37 μm.

The electrode-finger pitch λI outside the narrow-pitched electrode-finger portion of the fifth IDT 23 is equal to about 4.73 μm, the electrode-finger pitch λn of the narrow-pitched electrode-finger portion of the fifth IDT 23 is equal to about 4.25 μm, the electrode-finger pitch λ2I outside the narrow-pitched electrode-finger portion of the fourth and sixth IDTs 22 and 24 is equal to about 4.64 μm, and the electrode-finger pitch of the narrow-pitched electrode-finger portion of the fourth and sixth IDTs 22 and 24 is equal to about 4.31 μm.

The number of electrode fingers of the reflectors 15, 16, 25, and 26 is 70, respectively. Furthermore, although the metallization ratio is about 0.65, the metallization of the narrow-pitched electrode-finger portion in the first longitudinally coupled resonator-type surface acoustic wave filter portion 11 is about 0.70, and the metallization ratio of the narrow-pitched electrode-finger portion in the second longitudinally coupled resonator-type surface acoustic wave filter portion 21 is about 0.65. Furthermore, the electrode film thickness is about 0.09 λI.

When the wavelength determined by an electrode-finger pitch is represented by λI, the surface acoustic wave resonator 31 is configured as follows.

Cross width: 15.4 λI
Number of electrode fingers of IDT 31*a*: 141
Number of electrode fingers of reflectors 31*b* and 31*c*: 18 each
Metallization ratio: 0.75
Electrode film thickness: 0.09 λI Moreover, in the present preferred embodiment, when wiring is actually provided on the piezoelectric substrate, a terminal portion, on the side to be connected to the ground potential, of the first IDT 12 in FIG. 1 and a terminal, on the side to be connected to the ground potential, of the fourth IDT 22 are connected by a connection wiring and, in a similar manner, the terminal portions, on the side to be connected to the ground potential, of the IDTs 14 and 24 may be connected to each other by a connection wiring.

Figure 3:
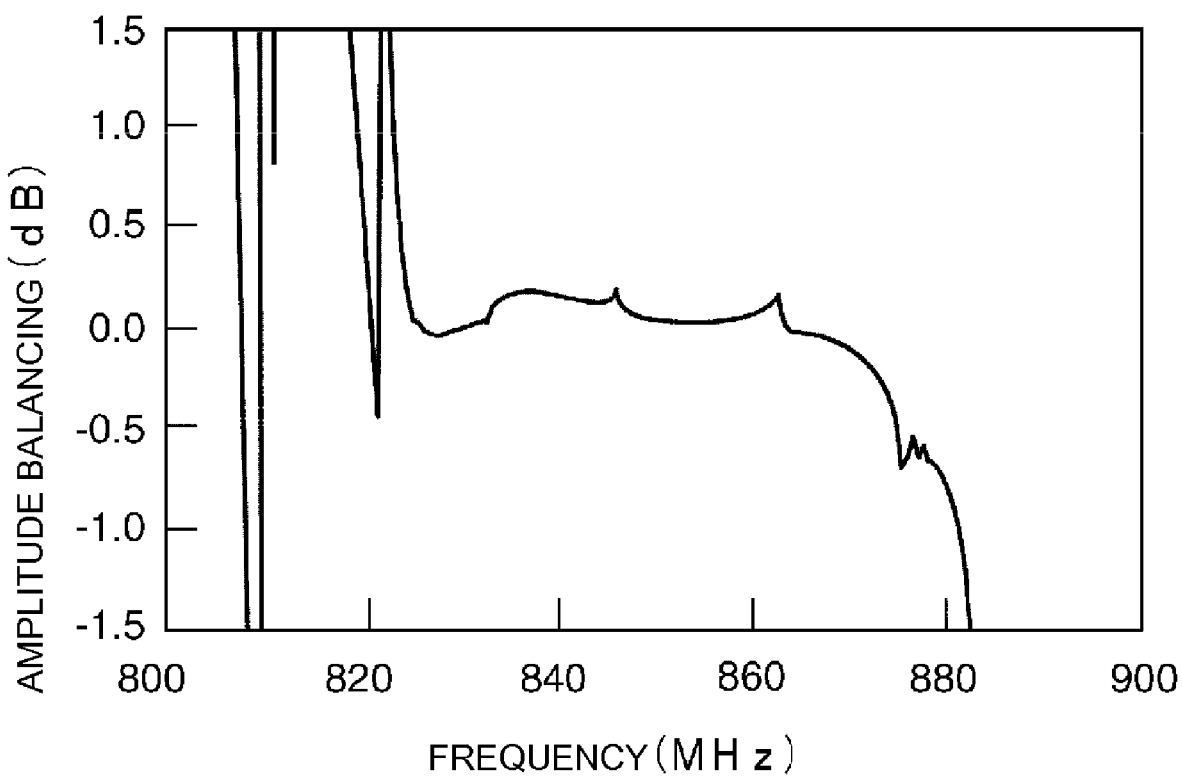
FIG. 3 shows amplitude balancing of the surface acoustic wave filter of the first preferred embodiment of the present invention.
Figure 4:
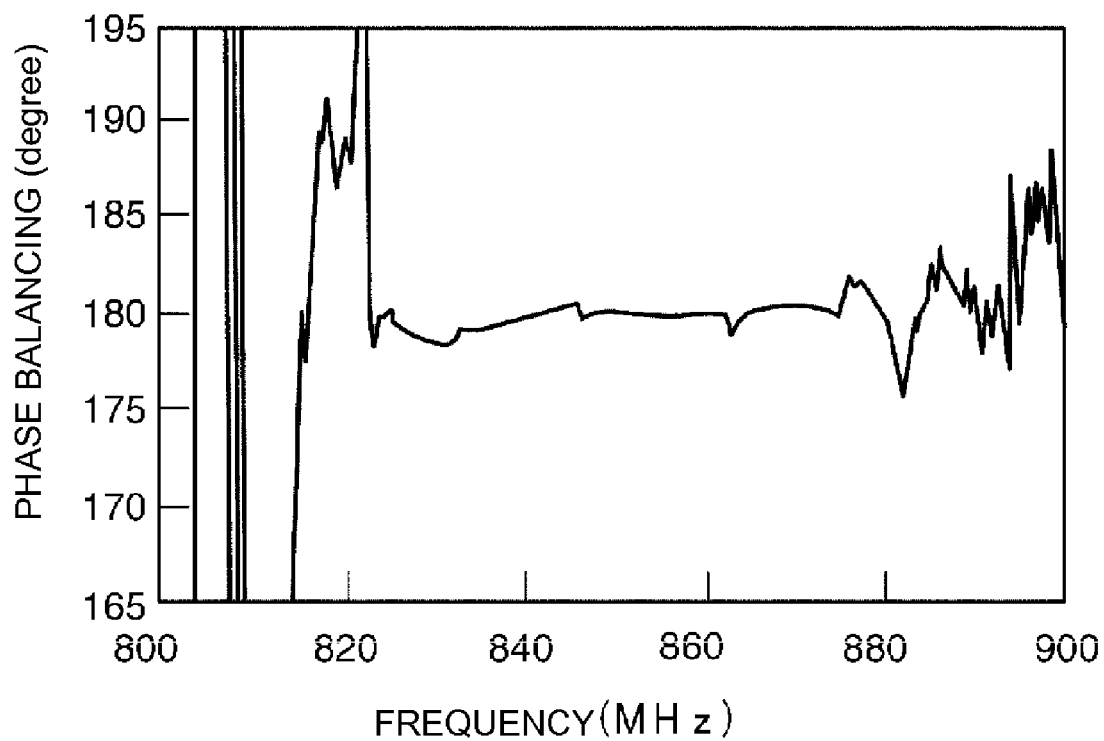
FIG. 4 shows phase balancing of the surface acoustic wave filter of the first preferred embodiment of the present invention.

The attenuation to frequency characteristics of the surface acoustic wave filter 1 of the present preferred embodiment, configured as described above, are shown in FIG. 2, and the amplitude balancing characteristics and phase balancing characteristics are shown in FIGS. 3 and 4, respectively.

Figure 5:
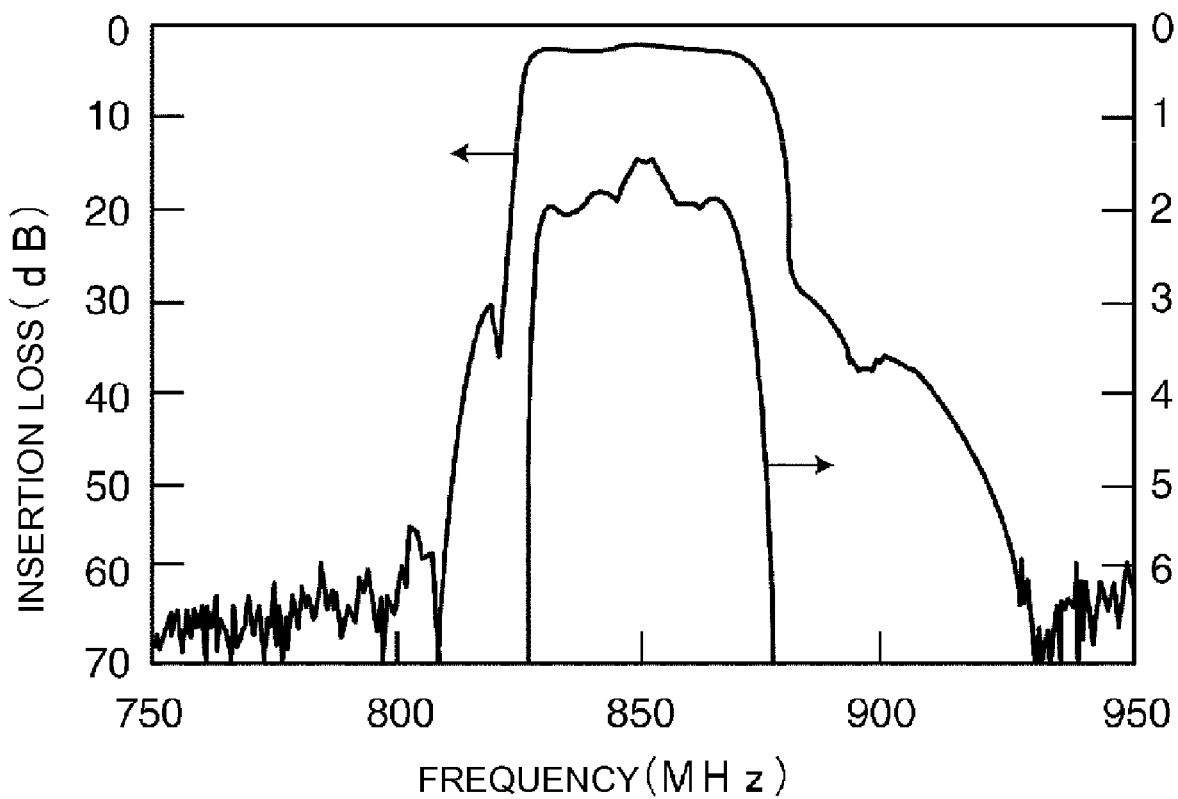
FIG. 5 shows characteristics of attenuation to frequency of a surface acoustic wave filter of a comparative example.
Figure 6:
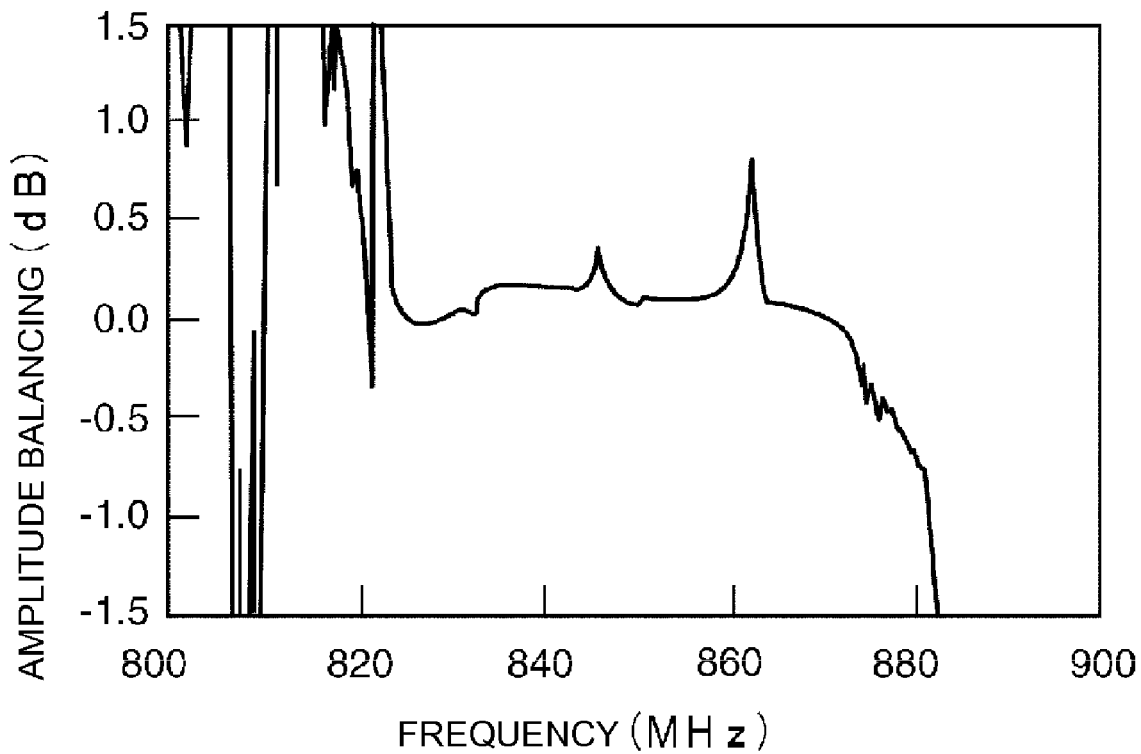
FIG. 6 shows amplitude balancing of the surface acoustic wave filter of the comparative example.
Figure 7:
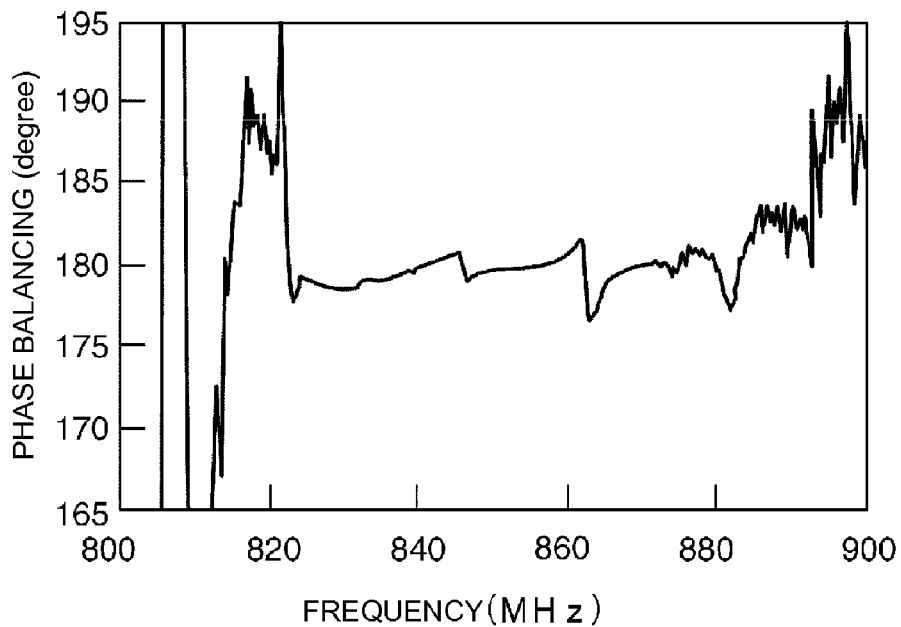
FIG. 7 shows phase balancing of the surface acoustic wave filter of the comparative example.

For comparison, a surface acoustic wave filter constructed in the same manner except in that the narrow-pitched electrode-finger portion, on the side of the IDT 13, of the IDT 14 is not series weighted was produced and the electrical characteristics were measured. FIG. 5 shows the attenuation to frequency characteristics of a surface acoustic wave filter as a comparative example. FIG. 6 shows the amplitude balancing characteristics, and FIG. 7 shows the phase balancing characteristics.

When FIG. 2 and FIG. 5 are compared, both have the passband of 832 MHz to 870 MHz. However, when the amplitude balancing and phase balancing in the passband are compared, in the comparative example, the amplitude balancing is about 0.83 dB and the phase balancing is about 3.6 degrees as a deviation from 180 degrees, and, in the present preferred embodiment, the amplitude balancing is about 0.17 dB and the phase balancing is about 1.7 degrees as a deviation from 180 degrees. Therefore, according to the present preferred embodiment, the amplitude balancing is improved about 0.65 dB and the phase balancing is improved about 2 degrees.

This improvement is caused by the following.

That is, in a plurality of electrode fingers 14*a* and 14*b* including the outermost electrode finger 14*a* of the IDT 14 on the side of the IDT 13, series weighting is performed so as to include the above-described floating electrode finger 14*c*. On the other hand, the portions in which the IDT 13 and the IDT 14 are adjacent to each other are of the same polarity. That is, both electrode fingers 13*a* and 14*a* are electrode fingers on the hot side. Then, a signal in the portion where the IDTs 13 and 14 are adjacent to each other is reversed 180 degrees in phase to that in the portion where the IDTs 12 and 13 are adjacent to each other. It is believed that the spike-like ripple in the amplitude balancing characteristics and phase balancing characteristics which were described above are caused by the portion in which the phase is reversed. In the present preferred embodiment, in this portion, when the above-described series weighting is performed, the application of an electric field to the portion in which the polarity is reversed changes, and, because of this, the spike-like ripple appearing on the amplitude balancing and phase balancing in the passband is effectively suppressed.

That is, in the configuration in which the first and second longitudinally coupled resonator-type surface acoustic wave filter portions 11 and 12 are two-stage cascade connected, on the side of the first surface acoustic wave filter 11 connected to the unbalanced input terminal 33, since a signal in the portion in which the first and second IDTs 12 and 13 are adjacent to each other is reversed in phase to that in the portion in which the second and third IDTs 13 and 14 are adjacent to each other as described above, in the portion in which the outermost electrode fingers adjacent to each other are of the same polarity, when weighting is performed such that the application of an electric field to at least one IDT is changed as described above, in the same manner, the above-described spike-like ripple is effectively suppressed.

Accordingly, in the present preferred embodiment, although series weighting is performed on the side of the IDT 14, series weighting may be performed on the side of the IDT 13, and also series weighting may be performed on the both sides in the portion in which the IDTs 13 and 14 are adjacent to each other.

Furthermore, in the present preferred embodiment, in the IDT 14, not only the above-descried series weighting is performed, but also the narrow-pitched electrode-finger portion N is provided. That is, although it is enough that only the weighting is performed in order to improve the above-described balancing, the narrow-pitched electrode-finger portion N may be simultaneously provided. Practically, in the IDT 14, the series weighting and the narrow-pitched electrode-finger portion N are provided together.

In the first longitudinally coupled resonator-type surface acoustic wave filter portion 11, the number of electrode fingers of the middle second IDT 13 is an odd number. Accordingly, the third IDT 14 is inverted to the first IDT 12, and a signal flowing in the first signal line 36 is reversed in phase to a signal flowing in the second signal line 37. With such a configuration, as described above, in the portion in which the IDTs 13 and 14 are adjacent to each other, the outermost electrode fingers which are close to each other are electrode fingers on the hot side.

In contrast to this, the number of electrode fingers of the IDT 13 may an even number. In this case, the first IDT and the third IDT are not inverted. Then, in this case, although the outermost electrode fingers where the second and third IDTs are close to each other are ground terminals, when the electrode fingers close to each other have the same polarity, a combination of not only hot to hot, but also ground to ground may be acceptable.

That is, in the first longitudinally coupled resonator-type surface acoustic wave filter portion connected to the unbalanced terminal, in the portion in which the first and second IDTs and the second and third IDTs are adjacent to each other, the portions where the outermost electrode fingers of the IDTs adjacent to each other are of the same polarity may be a combination of a grounded electrode finger and a grounded electrode finger.

Furthermore, in the longitudinally coupled resonator-type surface acoustic wave filter 1 of the present preferred embodiment, the number of electrode fingers of the middle fifth IDT 23 connected to first and second balanced output terminals 34 and 35 is an even number. In comparison with the case in which the total number of electrode fingers of the middle fifth IDT 23 of the surface acoustic wave filter portion 21 connected to the balanced output terminals 34 and 35 is an odd number, when the number is an even number, the balancing is further improved.

That is, the difference between the output of the first IDT 12, the fourth IDT 22, the fifth IDT 23, and the first balanced output terminal 34 and the output of the third IDT 14, the sixth IDT 24, the fifth IDT 23, and the second balanced signal terminal 35 by using a balanced-type IC connected to the fifth IDT, the output of the surface acoustic wave filter 1 is about double. Furthermore, since the output directly reaching the first balanced output terminal and the output directly reaching the second balanced signal terminal 35 have the same phase, the outputs cancel each other by the difference between them and the remainder is output as noise of the same phase signal.

In such a structure, it becomes a problem that the output directly reaching the first balanced output terminal 34 is large as compared to the output directly reaching the second balanced output terminal 35. However, in the present preferred embodiment, since the wave directly reaching the first balanced signal terminal 34 through the signal line 36 to the fourth IDT 22 from the first IDT 12 and the wave directly reaching the first balanced signal terminal 34 through the signal line 37 cancel each other, the balancing is improved.

Moreover, where the number of electrode fingers of the middle fifth IDT 23 of the second longitudinally coupled resonator-type surface acoustic wave filter portion 21 is an odd number, it is difficult to generate the spike-like ripple in the amplitude balancing characteristics and phase balancing characteristics, however, there is a concern that the balancing characteristics may be worsened. It is understood that this is caused by the difference between the number of electrode fingers connected to the first balanced output terminal 34 and the number of electrode fingers connected to the second balanced output terminal 35. Accordingly, preferably, as described above, the number of electrode fingers of the middle fifth IDT 23 in the second surface acoustic wave filter portion 221 is an even number.

In the first preferred embodiment of the present invention in FIG. 1, although the one-port surface acoustic wave resonator 31 is disposed between the unbalanced input terminal 33 and one terminal of the second IDT 13, a first one-port surface acoustic wave resonator is disposed between the first balanced output terminal 34 and the fifth IDT 23, and a second one-port surface acoustic wave resonator may be disposed between the second balanced output terminal 35 and the fifth IDT 23.

Furthermore, two one-port surface acoustic wave resonators are disposed between the first longitudinally coupled surface acoustic wave filter portion 11 and the second longitudinally coupled surface acoustic wave filter portion 21, a first one-port surface acoustic wave resonator is disposed between the first IDT 12 and the fifth fourth IDT 22, and a second one-port surface acoustic wave resonator may be disposed between the third IDT 14 and the IDT 24.

Furthermore, a two-port surface acoustic wave resonator is disposed between the first longitudinally coupled surface acoustic wave filter portion 11 and the second longitudinally coupled surface acoustic wave filter portion 21, a first port of the two-port surface acoustic wave resonator is disposed between the first IDT 12 and the fourth IDT 22, and a second port of the two-port surface acoustic wave resonator may be disposed between the third IDT 14 and the sixth IDT 24.

Figure 8:
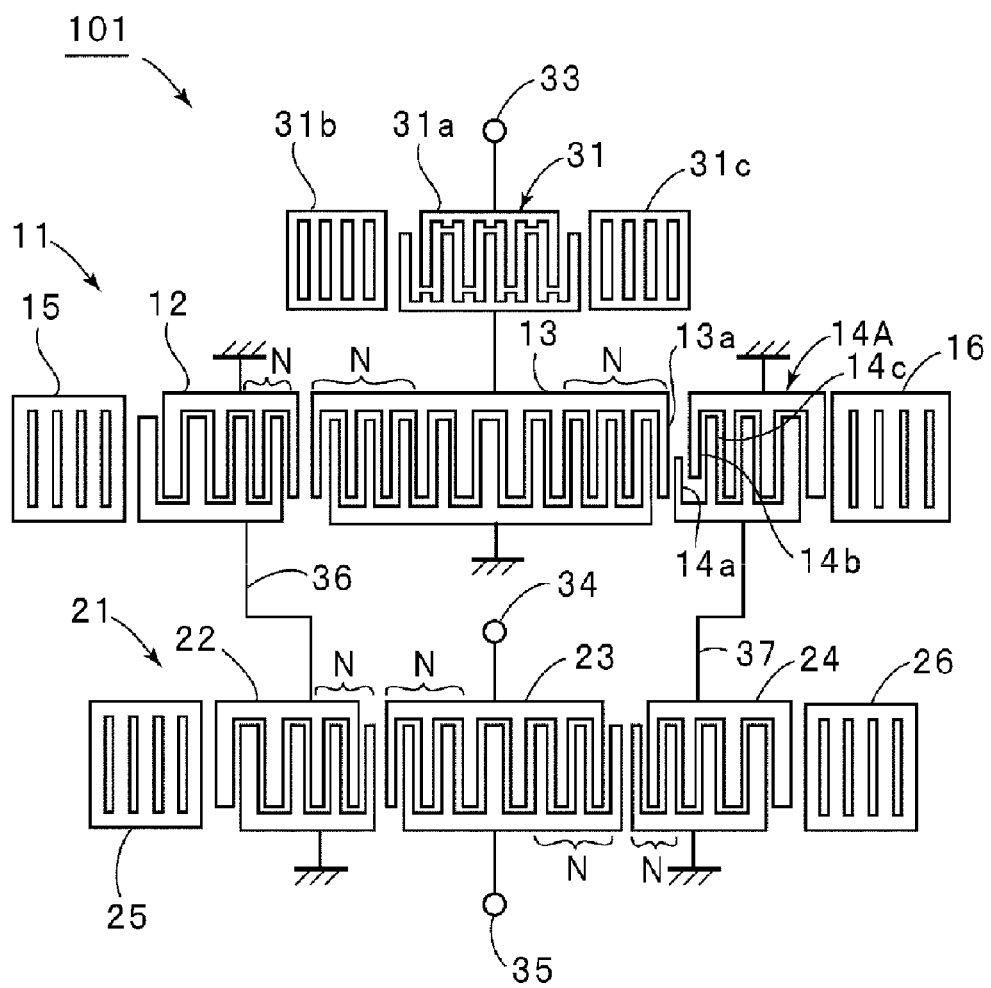
FIG. 8 is a schematic top view showing an electrode structure of a balanced-type surface acoustic wave filter according to a second preferred embodiment of the present invention.
Figure 9:
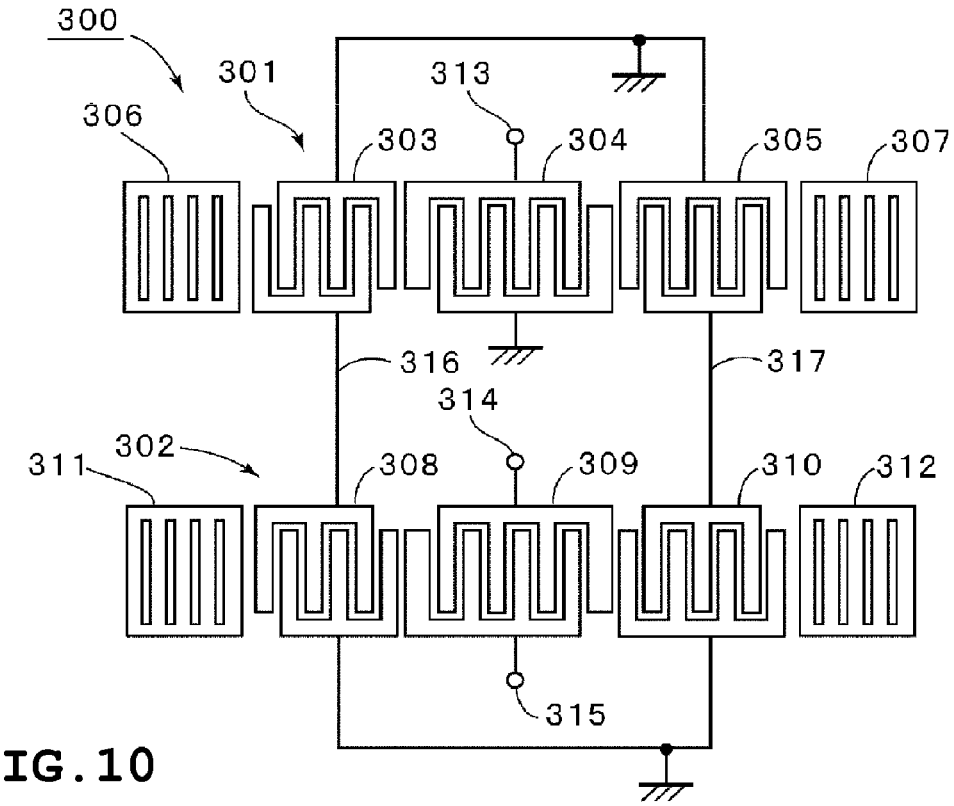
FIG. 9 is a schematic top view showing one example of a related balanced-type surface acoustic wave filter.
Figure 10:
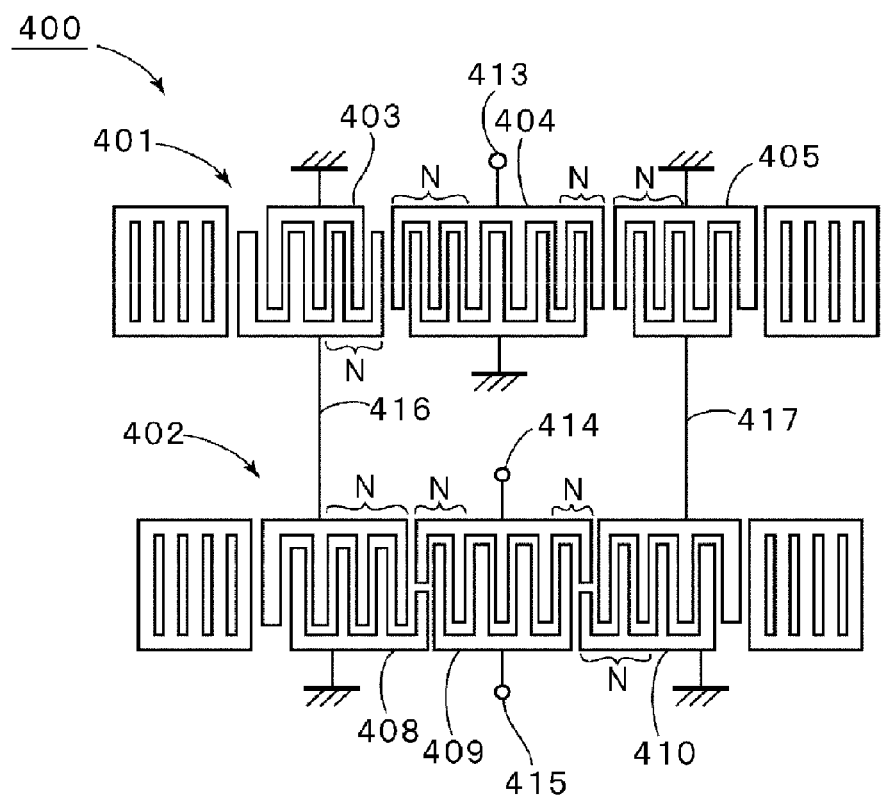
FIG. 10 is a schematic top view showing another example of a related balanced-type surface acoustic wave filter.

FIG. 8 is a schematic top view showing an electrode structure of a longitudinally coupled resonator-type surface acoustic wave filter according to a second preferred embodiment of the present invention. In a surface acoustic wave filter 101 of the second preferred embodiment, the structure is preferably the same as that of the longitudinally coupled resonator-type surface acoustic wave filter 1 of the first preferred embodiment except that, in a third IDT 14A, cross-width weighting is performed, instead of series weighting. Accordingly, the same portions are denoted by the same reference numerals and the description thereof is omitted.

In the present preferred embodiment, in the first longitudinally coupled resonator-type surface acoustic wave filter portion 11 connected to the unbalanced input terminal 33, the outermost electrode finger 13a of the IDT on the side of the IDT 14A and the outermost electrode finger 14a of the IDT 14A on the side of the IDT 13 are electrodes on the hot side and have the same polarity. Then, in the IDT 14A, cross-width weighting is performed in a plurality of electrode fingers 14a to 14c including the outermost electrode finger 14a.

Where cross-width weighting instead of series weighting is used, the electric field is changed in a portion where the IDT 14A and the IDT 13 are adjacent to each other, and accordingly, the spike-like ripple in the amplitude balancing characteristics and phase balancing characteristics are effectively suppressed.

As is clear from the first and second preferred embodiments, in the present invention, the weighting for improving the above-described amplitude balancing and phase balancing is not limited to series weighting and may include cross-width weighting, weighting by thinning-out, and weighting by changing the duty ratio. However, since the way an electric field is applied in the phase inversion portion of a signal can be effectively changed, weighting in which the length of a plurality of electrode fingers including the outermost electrode finger is changed, like series weighting and cross-width weighting, is desirable.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A balanced-type surface acoustic wave filter with a balanced-to-unbalanced conversion function including an unbalanced signal terminal and first and second balanced signal terminals, the balanced-type surface acoustic filter comprising:
a piezoelectric substrate;
a first longitudinally coupled resonator-type surface acoustic wave filter portion having first to third IDTs disposed along a propagation direction of a surface wave on the piezoelectric substrate, a middle second IDT of the first to third IDTs being connected to the unbalanced signal terminal; and
a second longitudinally coupled resonator-type surface acoustic wave filter portion having fourth to sixth IDTs disposed along the propagation direction of the surface wave on the piezoelectric substrate, the fourth IDT connected to the first IDT, and the fifth IDT connected to the first and second balanced signal terminals; wherein
an electric signal passing through a signal line connecting the first IDT and the fourth IDT is about 180 degrees different in phase from an electric signal passing through a signal line connecting the third IDT and the sixth IDT; and
in the first longitudinally coupled resonator-type surface acoustic wave filter portion, in at least one of the portion where the first and second IDTs are adjacent to each other and the portion where the second and third IDTs are adjacent to each other, in at least one of the adjacent IDTs, weighting is provided on a plurality of electrode fingers including an outermost electrode finger which is the closest to the adjacent IDT.

2. The balanced-type surface acoustic wave filter as claimed in claim 1, wherein, out of the at least one of the portion where the first and second IDTs are adjacent to each other and the portion where the second and third IDTs are adjacent to each other, the weighting is provided in a portion in which the adjacent outermost electrode fingers have the same polarity.

3. The balanced-type surface acoustic wave filter as claimed in claim 1, wherein the weighting is provided such that the length of a plurality of electrode fingers including the outermost electrode finger is different from the other electrode fingers.

4. The balanced-type surface acoustic wave filter as claimed in claim 3, wherein the weighting is a cross-width weighting.

5. The balanced-type surface acoustic wave filter as claimed in claim 3, wherein the weighting is a series weighting.

6. The balanced-type surface acoustic wave filter as claimed in claim 1, wherein the electrode fingers in which the weighting is performed are disposed in a narrow-pitched electrode-finger portion.

7. The balanced-type surface acoustic wave filter as claimed in claim 1, wherein, in the second longitudinally coupled resonator-type surface acoustic wave filter portion, the number of electrode fingers of the fifth IDT located in the middle in the propagation direction of the surface wave is an even number.

8. The balanced-type surface acoustic wave filter as claimed in claim 1, wherein one terminal of the fifth IDT in the middle of the second longitudinal resonator-type surface acoustic wave filter portion is connected to a first balanced terminal, and the other terminal is connected to a second balanced signal terminal.

9. The balanced-type surface acoustic wave filter as claimed in claim 1, wherein the first longitudinally coupled resonator-type surface acoustic filter portion includes reflectors disposed at both sides in the surface wave propagation direction of an area in which the first to third IDTs are disposed.

10. The balanced-type surface acoustic wave filter as claimed in claim 1, wherein the second longitudinally coupled resonator-type surface acoustic filter portion includes reflectors disposed at both sides in the surface wave propagation direction of an area in which the fourth to sixth IDTs are disposed.

11. The balanced-type surface acoustic wave filter as claimed in claim 1, wherein the first and second longitudinally coupled resonator-type surface acoustic filter portions are cascade connected to one another.

12. The balanced-type surface acoustic wave filter as claimed in claim 1, wherein the piezoelectric substrate is a 40±5 degree, Y-cut, X-propagation LiTaO$_3$ substrate.

* * * * *